(12) United States Patent
Pan et al.

(10) Patent No.: US 12,087,213 B2
(45) Date of Patent: Sep. 10, 2024

(54) BEVELED LIGHT-EMITTING LAMP BEAD, BEVELED LIGHT-EMITTING LAMP BEAD HOLDER, MANUFACTURING METHOD THEREFOR, AND DISPLAY DEVICE

(71) Applicant: FOSHAN NATIONSTAR OPTOELECTRONICS CO., LTD., Foshan (CN)

(72) Inventors: Libing Pan, Foshan (CN); Zhiguo Xie, Foshan (CN); Penghui Dong, Foshan (CN); Xiaoji Zhang, Foshan (CN); Danlei Gong, Foshan (CN); Man Zhao, Foshan (CN); Zihao Chen, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 0 days.

(21) Appl. No.: 18/457,755

(22) Filed: Aug. 29, 2023

(65) Prior Publication Data

US 2024/0144864 A1    May 2, 2024

(30) Foreign Application Priority Data

Oct. 31, 2022 (CN) .......................... 202211343136.3

(51) Int. Cl.
| | |
|---|---|
| G09G 3/32 | (2016.01) |
| F21K 9/235 | (2016.01) |
| F21K 9/237 | (2016.01) |
| F21K 9/238 | (2016.01) |
| F21W 131/30 | (2006.01) |

(52) U.S. Cl.
CPC ............... *G09G 3/32* (2013.01); *F21K 9/235* (2016.08); *F21K 9/237* (2016.08); *F21K 9/238* (2016.08); *F21W 2131/30* (2013.01); *G09G 2320/02* (2013.01)

(58) Field of Classification Search
CPC ...... G09G 3/32; G09G 2320/02; F21K 9/235; F21K 9/237; F21K 9/238; F21W 2131/30; H01L 33/48; H01L 33/0095; H01L 33/62
See application file for complete search history.

(56) References Cited

U.S. PATENT DOCUMENTS

| | | | |
|---|---|---|---|
| 2010/0096644 A1* | 4/2010 | Kong | .................... H01L 33/486 |
| | | | 257/E33.066 |
| 2019/0252584 A1* | 8/2019 | Liu | ......................... H01L 33/62 |

\* cited by examiner

*Primary Examiner* — Elmito Breval
(74) *Attorney, Agent, or Firm* — Culhane PLLC; Stephen J. Weed

(57) ABSTRACT

Provided are a beveled light-emitting lamp bead, a beveled light-emitting lamp bead holder, a manufacturing method therefor, and a display device. The beveled light-emitting lamp bead holder includes a holder body and a metal holder embedded in the holder body, where the holder body is divided by the metal holder into a cup shield located on a top side and a support structure located on a bottom side, a cup bottom in the cup shield is provided with a chip mounting surface parallel to a cup rim top surface, a bottom portion of the support structure is provided with a soldering plane, the soldering plane is electrically connected to the chip mounting surface through the metal holder, and an inclination angle is formed between the chip mounting surface and the soldering plane.

20 Claims, 11 Drawing Sheets

BEVELED LIGHT-EMITTING LAMP BEAD, BEVELED LIGHT-EMITTING LAMP BEAD HOLDER, MANUFACTURING METHOD THEREFOR, AND DISPLAY DEVICE

CROSS-REFERENCE TO RELATED APPLICATION

This application claims priority to Chinese Patent Application No. 202211343136.3 filed Oct. 31, 2022, the disclosure of which is incorporated herein by reference in its entirety.

TECHNICAL FIELD

The present disclosure relates to the field of display technology and, in particular, to a beveled light-emitting lamp bead, a beveled light-emitting lamp bead holder, a manufacturing method therefor, and a display device.

BACKGROUND

The existing television products present a picture directly through a television screen. However, the brightness of the background around the television cannot change with the change in the brightness of the picture. If the brightness of the picture is high while the background environment around the television is dark, the contrast between the picture and the background is large, causing great irritation to human eyes, easily resulting in visual fatigue and affecting eyesight. Decorative lamps are installed on the background wall around the television in the existing interior decoration, and the color atmosphere of the television picture is improved through the lighting effect brought by the decorative lamps. Although the problem that the contrast between the television picture and the surrounding background is too large can be improved, the decorative lighting cannot change with the change in the television picture, the color and brightness of the background presented are still extremely different from the color and brightness of the television picture, and the color and brightness between the television picture and the surrounding background cannot achieve a gradual smooth transition.

SUMMARY

In view of this, the present disclosure provides a beveled light-emitting lamp bead and a beveled light-emitting lamp bead holder. The beveled light-emitting lamp bead can emit light at an inclination angle, is suitable for television products, and when installed on the back side of a television screen, emits light toward the back side of the screen, thereby improving the color and brightness effects of the background around the television.

The present disclosure adopts the solutions described below.

The beveled light-emitting lamp bead holder includes a holder body and a metal holder embedded in the holder body. The holder body is divided by the metal holder into a cup shield located on a top side and a support structure located on a bottom side. A cup bottom in the cup shield is provided with a chip mounting surface parallel to a cup rim top surface. A bottom portion of the support structure is provided with a soldering plane. The soldering plane is electrically connected to the chip mounting surface through the metal holder. An inclination angle is formed between the chip mounting surface and the soldering plane.

In an embodiment, a top portion of the cup shield is provided with a suction surface connected to the cup rim top surface, and the suction surface is parallel to the soldering plane.

In an embodiment, the width of the suction surface is greater than or equal to 1 mm.

In an embodiment, the metal holder penetrates the holder body from the chip mounting surface to outer side surfaces of the holder body to be connected to the soldering plane. A portion of the metal holder penetrating out of the holder body is metal pins. The metal pins extend along a surface of the support structure to the soldering plane and include a first set of pins and a second set of pins located on opposite sides of the support structure, respectively.

In an embodiment, a portion of the metal holder penetrating the holder body includes a bent portion and a horizontal connection portion which are connected to each other. The bent portion is bent from the chip mounting surface toward the cup shield or the support structure. The horizontal connection portion is parallel to the chip mounting surface.

In an embodiment, the support structure is in a prismatic shape and includes the soldering plane and a connection side surface perpendicular to the soldering plane. The connection side surface is connected to the soldering plane to form a prismatic edge. The first set of pins penetrates out from an outer side surface of the holder body, is bent and extends to the soldering plane. The second set of pins penetrates out from an outer side surface of the holder body, is bent and extends from the connection side surface to the soldering plane. The length of the second set of pins is greater than the length of the first set of pins.

In an embodiment, the surface of the support structure protrudes outwardly to form a baffle for separating adjacent metal pins.

In an embodiment, the protruding height of the baffle is less than half of the thickness of a metal pin.

In an embodiment, the angle range of the inclination angle is 10° to 80°.

The beveled light-emitting lamp bead of the present disclosure includes the lamp bead holder described above and a light-emitting diode (LED) chip. The LED chip is disposed on the chip mounting surface in the cup shield.

The present disclosure further provides a display device. The display device includes the beveled light-emitting lamp bead described above.

The present disclosure further provides a method for manufacturing the beveled light-emitting lamp bead described above. The manufacturing method includes steps of die attachment and bonding, encapsulating, and die cutting. The step of die attachment and bonding includes: carrying the lamp bead holder using a carrier to keep the chip mounting surface in the holder body horizontal, placing and fixing the LED chip on the chip mounting surface in the cup shield, and bonding the LED chip to the metal holder; where the carrier is provided with a groove, and the groove is configured to load the support structure located on the bottom side of the holder body.

The present disclosure at least has the following beneficial effects.

(1) The beveled light-emitting lamp bead can emit light at an inclination angle, is applicable to display devices such as a television, and can be installed on the back side of the television through the soldering plane on the bottom. The beveled light-emitting lamp bead can project light which changes with the content presented in the picture of the television screen and which is close to the light of the picture of the television screen onto the television background wall and synchronize the projected light with the picture of the television screen in colors so that the brightness and color between the television screen and the surrounding background smoothly changes, thereby protecting eyes and enhancing the atmosphere effect of the television screen.

(2) A suction surface is disposed on the top portion of the beveled light-emitting bead for suction nozzles to adsorb, thereby achieving the operation of suction and transfer of the lamp bead by automatic equipment in the installation process.

(3) A baffle is disposed between adjacent metal pins to protect, fix and limit the position of the pins, thereby improving the problems such as deformation, displacement and short circuits due to contact that are caused by the excessive length of metal pins in the inclined design, and in addition, the metal pins are set to have a specific thickness, thereby enhancing the strength of the pins and preventing the pin from deformation.

(4) The inclination angle of the beveled light-emitting lamp bead is set between 10° and 80°, and if the light-emitting lamp beads with different light-emitting angles are soldered to the television backplane, the light emitted onto the television background wall can achieve a better gradual smooth transition between the picture of the television screen and the surrounding background, thereby achieving a better picture atmosphere effect.

For a better understanding and implementation of the present disclosure, the present disclosure will be described hereinafter in detail in conjunction with drawings.

Figure 1:
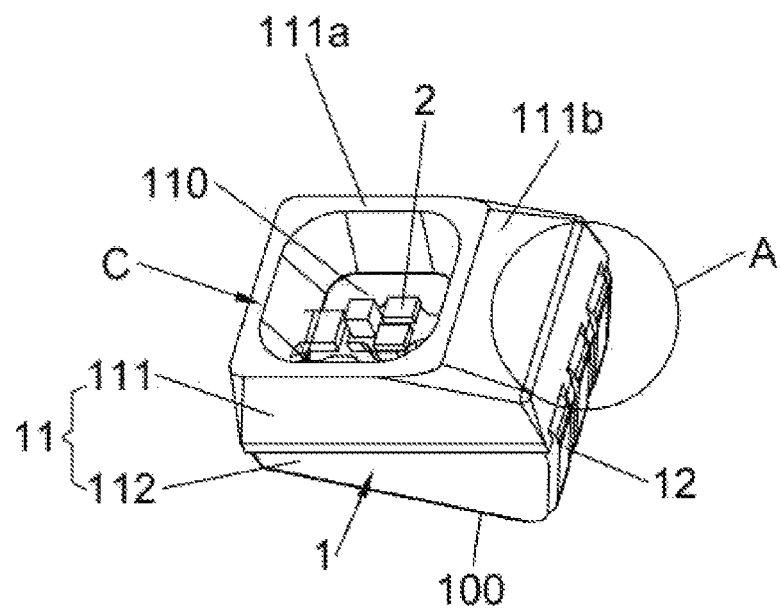
FIG. 1 is a perspective view of a beveled light-emitting lamp bead with an inclination angle of 20° in Embodiment one.

REFERENCE LIST 1 lamp bead holder
1' frame
11 holder body
111 cup shield
C cup rim
111a cup rim top surface
111b suction surface
111c sidewall
111d sidewall
110 chip mounting surface
112 support structure
112a connection side surface
112b outer side surface
112c outer side surface
100 soldering plane
D width of the suction surface
α inclination angle
113 prismatic edge
114 baffle
L thickness of the baffle
12 metal holder
12' metal strip
120 metal pin
120a first set of pins
120b second set of pins
S pin spacing
121a die attachment pad
121b wire bonding pad
122 bent portion
123 horizontal connection portion
2 LED chip
21 red-light chip
22 green-light chip
23 blue-light chip
3 carrier
30 groove
31 lower carrier
32 upper carrier
320 hollow part

DETAILED DESCRIPTION

Embodiment One

With reference to FIGS. 1 to 10, a beveled light-emitting lamp bead of this embodiment includes a lamp bead holder 1 and an LED chip 2.

The lamp bead holder 1 includes a holder body 11 and a metal holder 12 embedded in the holder body 11. The holder body 11 is divided by the metal holder 12 into a cup shield 111 located on a top side and a support structure 112 located on a bottom side. A cup bottom in the cup shield 111 is provided with a chip mounting surface 110 parallel to a cup rim top surface 111a. A bottom portion of the support structure 112 is provided with a soldering plane 100. The soldering plane 100 is electrically connected to the chip mounting surface 110 through the metal holder 12.

Figure 4:
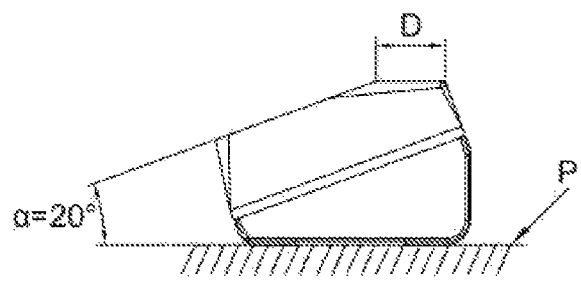
FIG. 4 is a view of the installation of the beveled light-emitting lamp bead of Embodiment one on a plane.

An inclination angle α is formed between the chip mounting surface 110 and the soldering plane 100. Since the chip mounting surface 110 is parallel to the cup rim top surface 111a, an included angle between the cup rim top surface 111a (which is generally considered as a light-emitting surface of a lamp bead) and the soldering plane 100 is also the inclination angle α, as shown in FIG. 4 which is a view of the installation of the soldering plane 100 of the beveled light-emitting lamp bead on a plane P. To clearly present the inclination angle α, the inclination angle α is marked with the included angle between the cup rim top surface 111a on the top and the soldering plane 100 in drawings of the present disclosure.

The inclination angle α in this embodiment is 20°. The LED chip 2 is disposed on the chip mounting surface 110 in the cup shield 111, and thus, the LED chip 2 is perpendicular to a light emission direction of the chip mounting surface 100 and forms a non-perpendicular inclination angle with the soldering plane 100.

To facilitate suction and transfer of a suction nozzle in the lamp bead installation process, a top portion of the cup shield 111 is provided with a suction surface 111b connected to the cup rim top surface 111a, and the suction surface 111b is parallel to the soldering plane 100 and used for the suction nozzle to adsorb. In an embodiment, as shown in FIG. 4, the width D of the suction surface 111b is greater than or equal to 1 mm to accommodate the size of the suction nozzle of a surface-mount device (SMD) pick-and-place machine.

Figure 2:
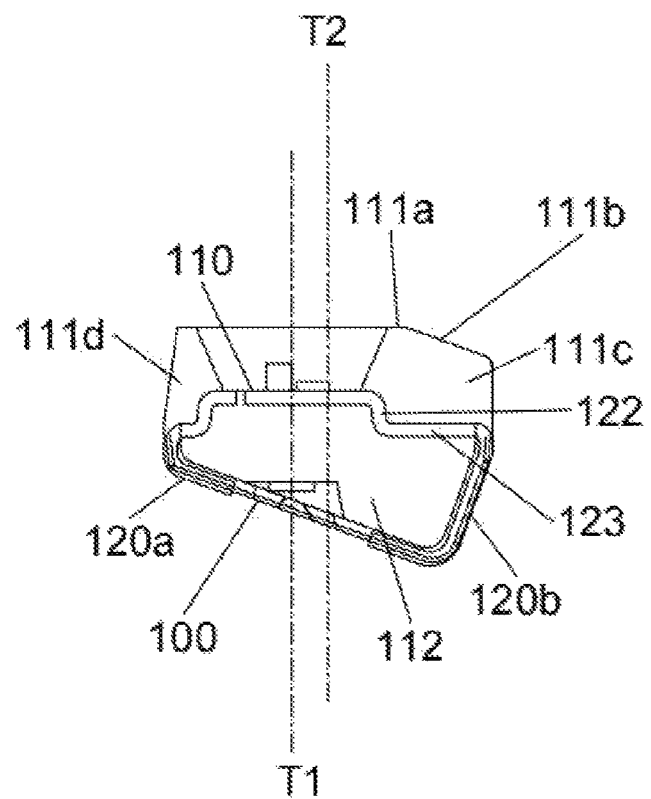
FIG. 2 is a view of the internal structure of the beveled light-emitting lamp bead of Embodiment one in a front view direction.
Figure 3:
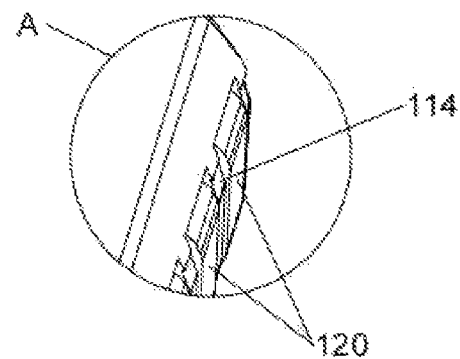
FIG. 3 is an enlarged view of a portion A of FIG. 1.

In an embodiment, as shown in FIG. 2, the metal holder 12 penetrates the holder body 11 from the chip mounting surface 110 to outer side surfaces of the holder body 11 to be connected to the soldering plane 100. A portion of the metal holder 12 penetrating out of the holder body 11 is metal pins 120. The metal pins 120 extend along a surface of the support structure 112 to the soldering plane 100 and include a first set of pins 120a and a second set of pins 120b located on opposite sides of the support structure 112, respectively.

Figure 6:
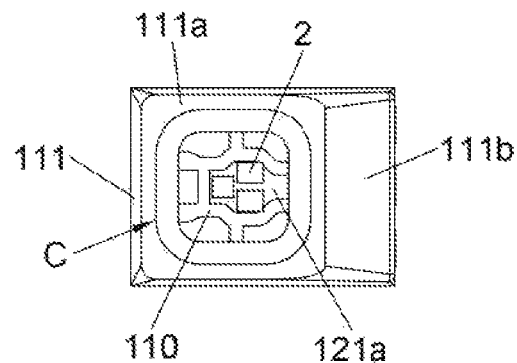
FIG. 6 is a top view of the beveled light-emitting lamp bead of Embodiment one.
Figure 7:
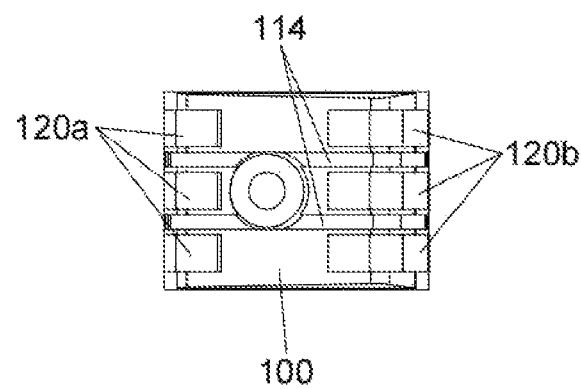
FIG. 7 is a bottom view of the beveled light-emitting lamp bead of Embodiment one.
Figure 8:
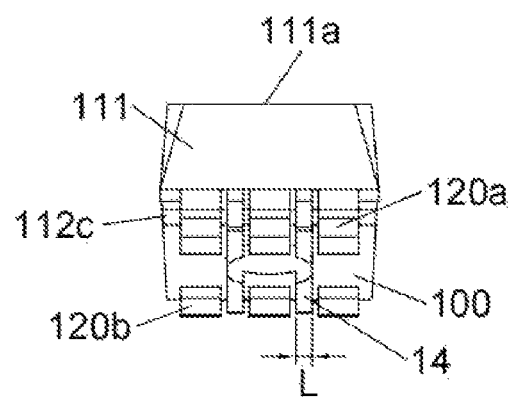
FIG. 8 is a left view of the beveled light-emitting lamp bead of Embodiment one.
Figure 9:
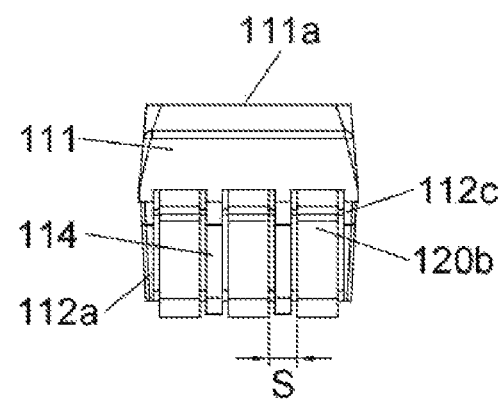
FIG. 9 is a right view of the beveled light-emitting lamp bead of Embodiment one.

As shown in FIGS. 1 and 6, the cup shield 111 is enclosed by four sidewalls, and the cup rim C is a square with four rounded corners. The cup rim top surface 111a is a square ring with four outer edges. With reference to FIG. 2, the suction surface 111b is disposed in a top portion of one sidewall 111c and is connected to one outer edge of the cup rim top surface 111a.

Since the suction surface 111b with a certain width needs to be set and the thickness of the sidewall 111c is greater than the thickness of a sidewall 111d opposite to the sidewall 111c, a cup rim center line T1 of the cup shield 111 is offset from a center line T2 of the cup shield 111. As shown in FIG. 2, the cup rim center line T1 of the cup shield 111 is on the left side of the entire holder.

In an embodiment, the metal holder 12 penetrates the sidewall 111c provided with the suction surface 111b and the sidewall 111d opposite to the sidewall 111c, respectively, and thus, the length of a portion of the metal holder 12 penetrating the sidewall 111c is greater than the length of a portion of the metal holder 12 penetrating the sidewall 111d, as shown in FIG. 2.

In another implementation, the thickness of the sidewall 111d may be increased to be the same as the thickness of the sidewall 111c so that the cup rim center line T1 of the cup shield 111 overlaps the center line T2 of the cup shield 111, that is, the center of the cup rim C reaches the center of the entire holder, and the length of the portion of the metal holder 12 penetrating the sidewall 111c is equal to the length of the portion of the metal holder 12 penetrating the sidewall 111d. However, when the thickness of the sidewall 111d is increased, the material cost is increased, and the size of a lamp bead product is also increased. In addition, in another implementation, the cup rim C of the cup shield 111 may be set to a circular shape, an oval shape, another polygonal shape or an irregular shape.

To prevent water vapors from invading the interior from a connection between the metal pins 120 and the holder body 11, a portion of the metal holder 12 penetrating the holder body 11 includes a bent portion 122 and a horizontal connection portion 123 which are connected to each other. The bent portion 122 is bent from the chip mounting surface 110 toward the cup shield 111 or the support structure 112. The horizontal connection portion 123 is parallel to the chip mounting surface 110 and the cup rim top surface 111a. In an embodiment, the bent portion 122 is bent from the chip mounting surface 110 toward the support structure 112, that is, the bent portion 122 is bent toward the bottom side, thereby effectively preventing water vapors from entering the cup shield 111.

Figure 5:
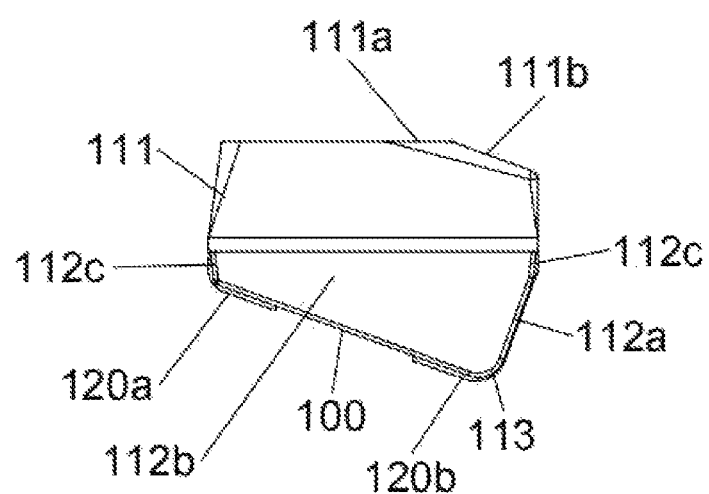
FIG. 5 is a front view of the beveled light-emitting lamp bead of Embodiment one.

As shown in FIG. 5, the support structure 112 is in a prismatic shape and includes the soldering plane 100 on the bottom portion, one connection side surface 112a, two outer side surfaces 112b that are opposite and parallel to each other, and two outer side surfaces 112c that are opposite and parallel to each other.

The two outer side surfaces 112b are directly connected to the soldering plane 100. One outer side surface 112c is directly connected to the soldering plane 100, and the other outer side surface 112c is connected to the soldering plane 100 through the connection side surface 112a. The outer side surface 112b and the outer side surface 112c are perpendicular to each other and are both perpendicular to the cup rim top surface 111a. The outer side surface 112b is perpendicular to the soldering plane 100, and the outer side surface 112c is not perpendicular to the soldering plane 100. The connection side surface 112a is perpendicular to the soldering plane 100 but not to the cup rim top surface 111a, and the included angle between the connection side surface 112a and the cup rim top surface 111a is equal to the supplementary angle of the inclination angle α. The connection side surface 112a is connected to the soldering plane 100 in a smooth transition manner to form a prismatic edge 113.

The shape and structure of the support structure 112 accommodates the design of the inclination angle α and enables the gravity of an overall irregularly-shaped lamp bead to be more centered so that the lamp bead can be in a relatively stable state when installed on the plane P, as shown in FIG. 4, thereby saving the material used in the support structure 112.

As shown in FIGS. 2 and 5, the first set of pins 120a penetrates out from one outer side surface 112c of the holder body 11, is bent and extends to the soldering plane 100, and the second set of pins 120b penetrates out from the other outer side surface 112c of the holder body 11, is bent and extends from the connection side surface 112a to the soldering plane 100. The length of the second set of pins 120b is greater than the length of the first set of pins 120a. In an embodiment, each set has three pins.

In an embodiment, the material of the metal holder 12 is copper, and the thickness of the metal holder 12 is 0.15 mm to 0.25 mm.

The material of the support body 11 is plastic, and the support body 11 is manufactured by an injection molding process with no less than eight injection molding surfaces. In the embodiments of the present disclosure, as shown in FIGS. 2, 7, 16B, 17B, and 18B, a concave injection molding hole in the injection molded support body 11 is disposed below the middle of the chip mounting surface 110. The material of the support body 11 may be a high-molecular polymer such as polyphthalamide (PPA), poly (cyclohexanedimethanol terephthalate) (PCT), liquid crystal polymer (LCP), epoxy molding compound (EMC), and the color of the support body 11 may be white or black. In an embodiment, the material of the support body 11 is white PPA.

As shown in FIGS. 1 to 3, 5, and 7 to 9, to avoid a short circuit caused by deformation or displacement of the metal pin 120 due to the excessive length of the metal pin 120, the surface of the support structure 112 protrudes outwardly between adjacent metal pins 120 to form a baffle 114 for separating the adjacent metal pins 120. The baffle 114 that separates adjacent pins in the first set of pins 120a is formed by continuously protruding along the outer side surface 112c where the first set of pins 120a is located and the soldering plane 100. The baffle 114 that separates adjacent pins in the second set of pins 120b is formed by continuously protruding along the outer side surface 112c where the second set of pins 120b is located, the connection side surface 112a, and the soldering plane 100.

In an embodiment, the protruding height of the baffle 114 is less than half of the thickness of the metal pin 120. If the protruding height of the baffle 114 is too high, the metal pin 120 is shielded, and the exposed area of the metal pin 120 is too small, which is not conducive to the soldering of the soldering plane 100 located at the bottom portion to a circuit board in the lamp bead installation process. If the protruding height of the baffle 114 is too small, the baffle 114 cannot protect, limit or separate the metal pins 120, resulting in that the metal pin 120 is deformed and falls off after being collided in the manufacturing process, and adjacent pins are also prone to contact with each other due to displacement and thus cause a short circuit.

In addition, the thickness L of the baffle 114 ranges from 0.15 mm to 0.3 mm, and the thickness in such a range is relatively proper. If the baffle 114 is too thin, the baffle 114 cannot be easily manufactured by injection molding with plastic and becomes prone to fracture. If the baffle 114 is too thick, the bending processing of the metal pin 120 is affected.

The thickness of the metal pin 120 ranges from 0.15 mm to 0.25 mm, which is consistent with the thickness of a copper plate or metal strip used for manufacturing the metal holder 12. With the thickness in such a range, the metal pin 120 can be effectively prevented from being bent and deformed, especially the second set of pins 120b that is relatively long can be prevented from being bent and deformed, and the metal pin 120 can be prevented from being too thick to be easily bent and processed.

The pin spacing S in the first set of pins 120a and the pin spacing S in the second set of pins 120b are both 0.15 mm to 0.4 mm. The pin spacing S is not too small, avoiding the risk of a short circuit caused by the contact between adjacent pins. The pin spacing S is also not too large, avoiding the pin from being easily bent and deformed due to the reduction of mechanical strength caused by the excessively narrow width of each pin.

Figure 10:
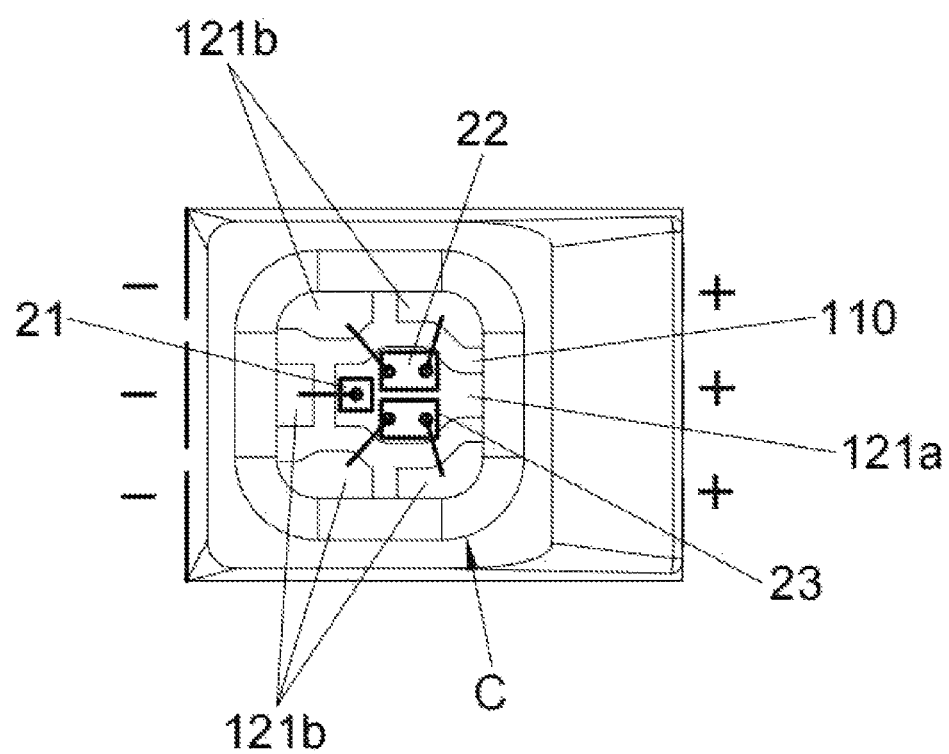
FIG. 10 is a view of the layout of pads and chips in the beveled light-emitting lamp bead of Embodiment one.

As shown in FIG. 10, the portion of the metal holder 12 disposed on the chip mounting surface 110 is a pad used for fixing and connecting the LED chip 2 and includes one die attachment pad 121a and five wire bonding pads 121b. The die attachment pad 121a is located in the center of the chip mounting surface 110, and the five wire bonding pads 121b are disposed around the die attachment pad 121a to facilitate wire bonding. Such a pad shape design can meet the arrangement requirements of the delta arrangement of three chips and the wire requirements.

The number of LED chips 2 is at least three so that the emitted light forms red, green, and blue (RGB) three-color mixed light or red, green, blue, and white (RGBW) four-color mixed light. In an embodiment, the LED chips 2 are a red-light chip 21, a green-light chip 22, and a blue-light chip 23. These chips are disposed on the die attachment pad 121a in a delta shape and are located in the center of the cup rim C. Therefore, the light emitted by the three chips can be evenly mixed. The position of the green-light chip 22 and the position of the blue-light chip 23 are interchangeable, and both the green-light chip 22 and the blue-light chip 23 are disposed on one side of the red-light chip 21, to meet the arrangement requirements of the delta arrangement of the three chips and the wire requirements. Each chip is separately connected to wire bonding pads 121b through wires.

The beveled light-emitting lamp bead may be applicable to display devices, is particularly suitable for television products, and may be installed on the backplane of the television, to achieve light emission toward the back side of the television screen. The lamp bead is absorbed by a suction nozzle during installation, and the suction nozzle absorbs the suction surface 111b under a negative pressure to absorb the lamp bead.

In an embodiment, in the installation process, an SMD pick-and-place machine is used for absorbing lamp beads. Multiple suction nozzles of the SMD pick-and-place machine are fixed at the top of a rotating head and are on the same horizontal plane. The nozzles move above the corresponding lamp beads with the rotation of the rotating head and adsorb the suction surfaces 111b of the lamp beads through the inside negative pressure, or the nozzles mechanically extend, contact the suction surfaces 111b, form the inside negative pressure, and then absorb the suction surfaces 111b, achieving the operations such as the suction and transfer of the beveled light-emitting lamp beads by automatic equipment. During the suction of lamp beads, the suction surface 111b parallel to the soldering plane 100 is kept parallel to the suction nozzle to ensure that the negative adsorption force can be formed through sealing contact when the suction nozzle contacts the suction surface 111b, thereby solving the problem that the lamp bead cannot be absorbed by the suction nozzle because the cup rim top surface 111a of the cup shield 111 is inclined relative to the soldering plane 100 or the defects exist on the suction surface 111b and ensuring the feasibility and operability of the installation of the beveled light-emitting lamp beads.

A method for manufacturing the beveled light-emitting lamp bead includes the steps of holder manufacturing, die attachment and bonding, encapsulating, and die cutting. The method is substantially the same as the existing lamp bead manufacturing method and is characterized by the fact that the manufactured holder is the lamp bead holder 1 described above.

Figure 12A:
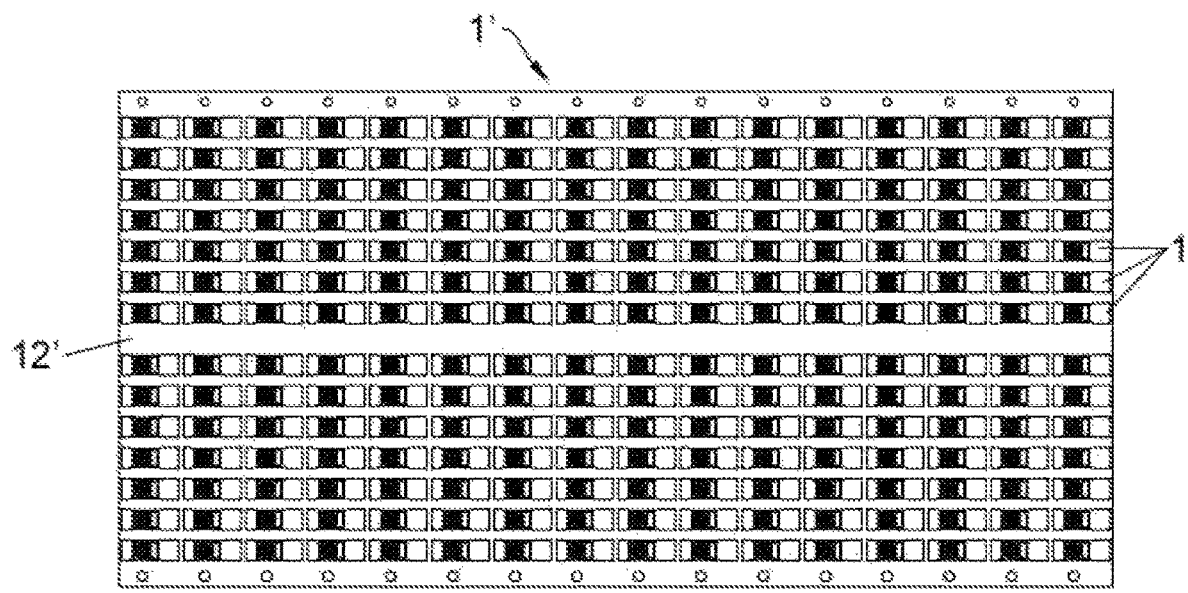
FIG. 12A is a top view of a frame formed by connecting multiple lamp bead holders.
Figure 12B:
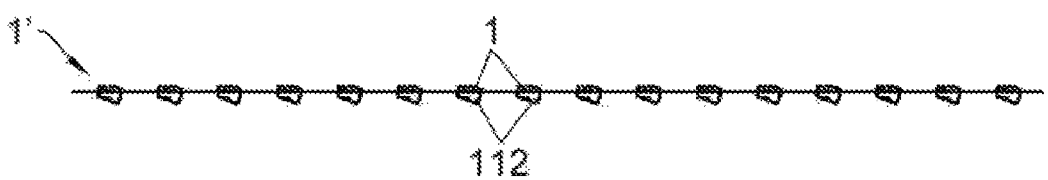
FIG. 12B is a front view of the frame formed by connecting multiple lamp bead holders.
Figure 12C:
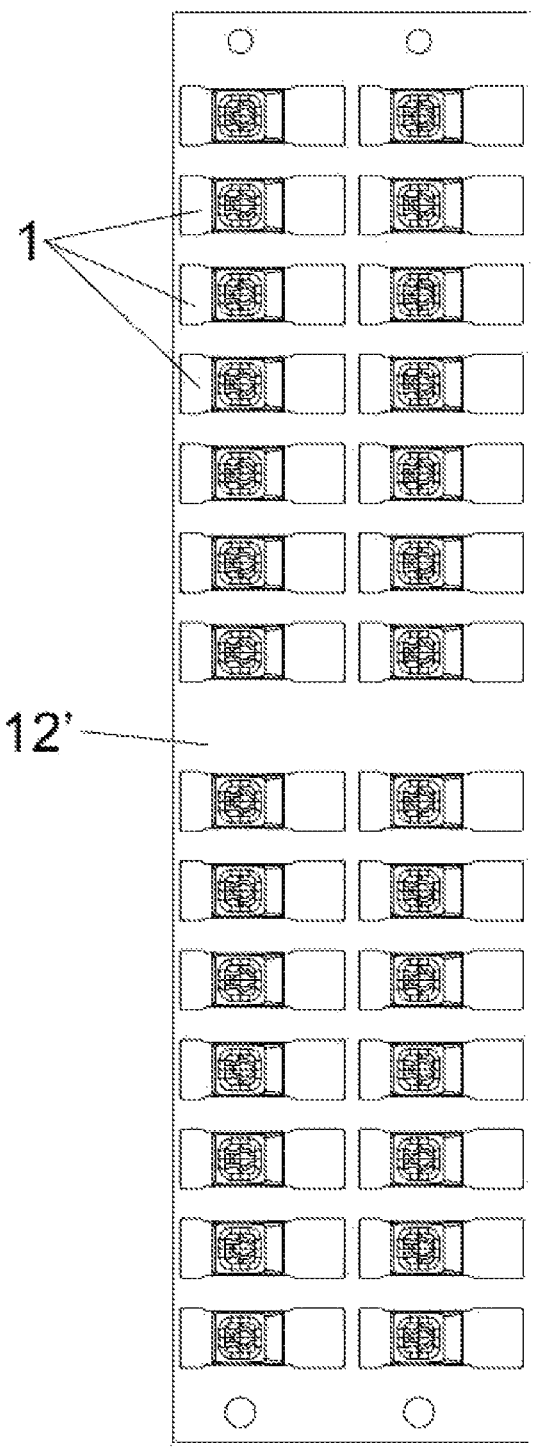
FIG. 12C is an enlarged view of two leftmost columns of lamp bead holders in the frame shown in FIG. 12A.

The step of holder manufacturing includes the following: die cutting is performed on a metal strip 12', then injection molding is performed on the metal strip 12' to obtain the holder body 11, and the metal holder 12 is formed by bending processing. In this manner, a frame 1' on which multiple lamp bead holders 1 are connected to each other is obtained. As shown in FIGS. 12A to 12C, the lamp bead holders 1 are arranged in rows and columns in the frame 1', and FIG. 12A exemplarily shows that the frame 1' contains 224 lamp bead holders 1 arranged in 14 rows*16 columns.

The step of die attachment and bonding includes the following: the frame is carried using a carrier 3 so that the chip mounting surface 110 in each holder body 11 is kept horizontal, the LED chips 2 are placed and fixed on the chip mounting surface 110 in the cup shield 111, and the LED chips 2 are then bonded to the metal holder 12. The bonding may be achieved by wire bonding, eutectic bonding or conductive material bonding, and in this embodiment, wire bonding is used for connecting chips to the wire bonding pads through wires, as shown in FIG. 10.

Figure 11:
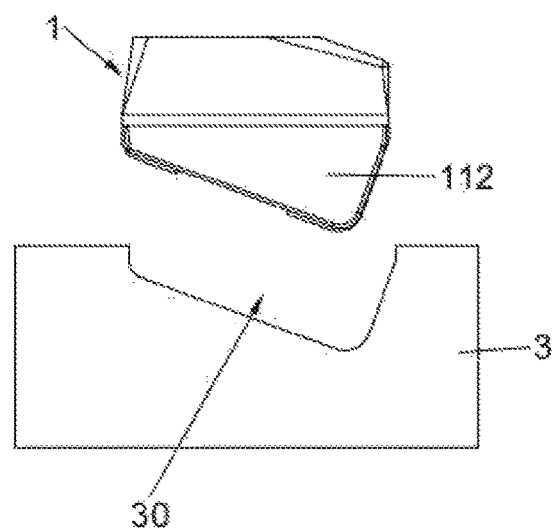
FIG. 11 is a partial simplified structural view of a carrier having a groove for carrying a beveled light-emitting lamp bead holder.

Due to the existence of the inclination angle α, the chip mounting surface 110 is not horizontal when the holder body 11 is placed directly on a flat carrier plate, resulting in the inability to perform operations of die attachment and wire bonding. To solve this problem, as shown in FIG. 11, the carrier 3 is provided with a groove 30, the groove 30 is configured to load the support structure 112 located on the bottom side of the holder body 11, and in an embodiment, the shape of the groove 30 matches the prismatic shape of the bottom portion of the support structure 112 to achieve stable support, so that the chip mounting surface 110 is kept horizontal.

In an embodiment, the carrier 3 is provided with multiple grooves 30 corresponding to the frame 1' on which multiple lamp bead holders 1 are connected to each other. The structure of the carrier used in the step of die attachment and the structure of the carrier used in the step of wire bonding differs due to the difference in die attachment machines and wire bonding machines used in actual production. The main difference in the structure of the carrier is that the carrier 30 used in the step of die attachment is provided with the same number of grooves 30 as the lamp bead holders 1 in the frame 1' to stabilize the support structures 112 located on the bottom sides of all lamp bead holders 1 in the frame 1' during die attachment, and the carrier 30 used in the step of wire bonding has a smaller number of grooves 30 to stabilize the support structures 112 located on the bottom sides of several columns of lamp bead holders 1 in the frame 1' during wire bonding.

Figure 13A:
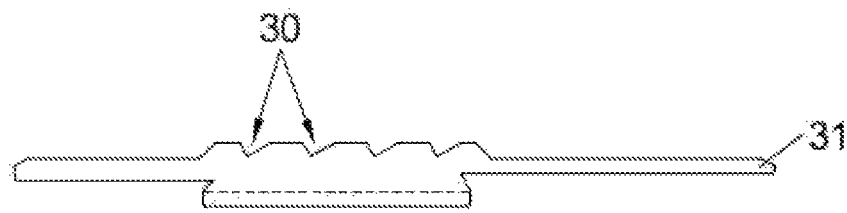
FIG. 13A a top view of a lower carrier.
Figure 13B:
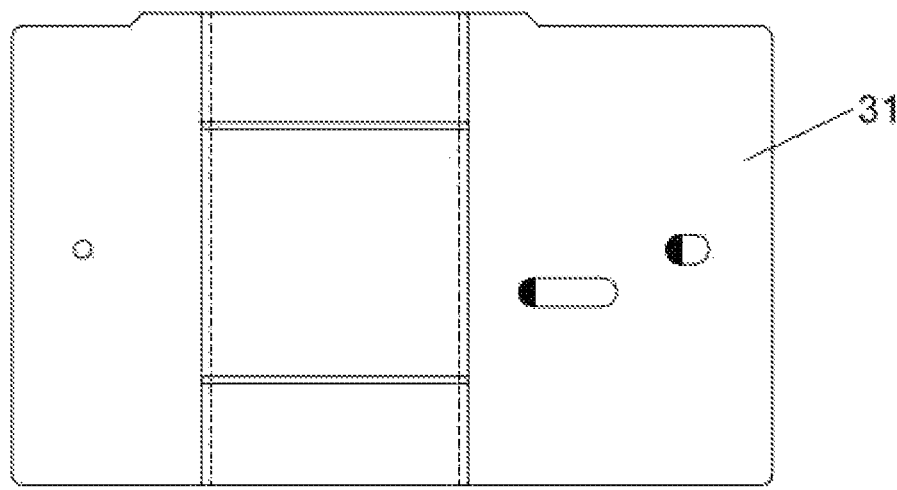
FIG. 13B is a front view of the lower carrier.
Figure 13C:
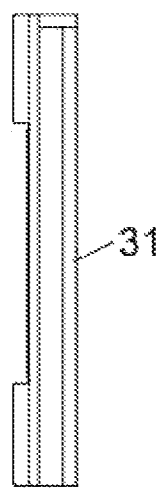
FIG. 13C is a side view of the lower carrier.
Figure 14A:
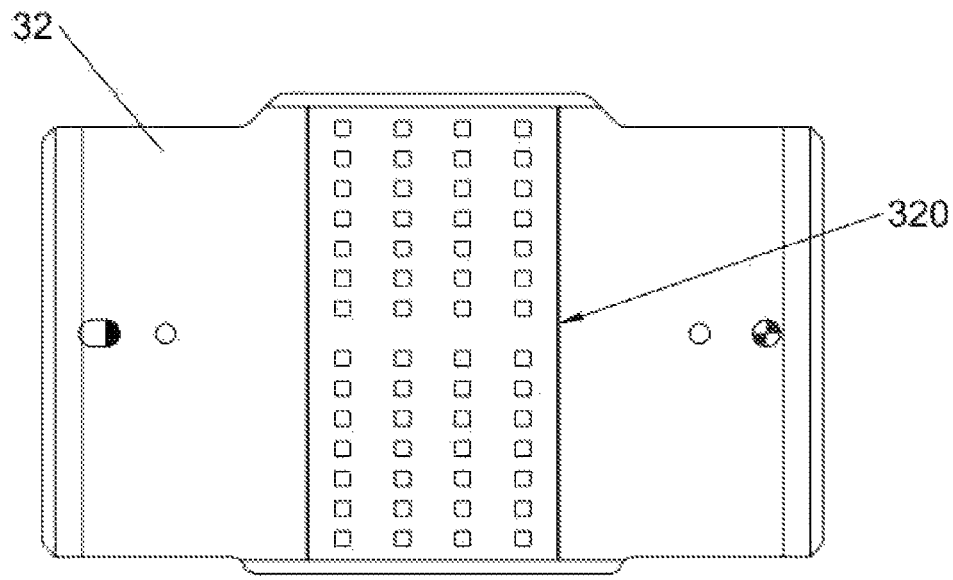
FIG. 14A a front view of an upper carrier.
Figure 14B:
FIG. 14B is a top view of the upper carrier.
Figure 14C:
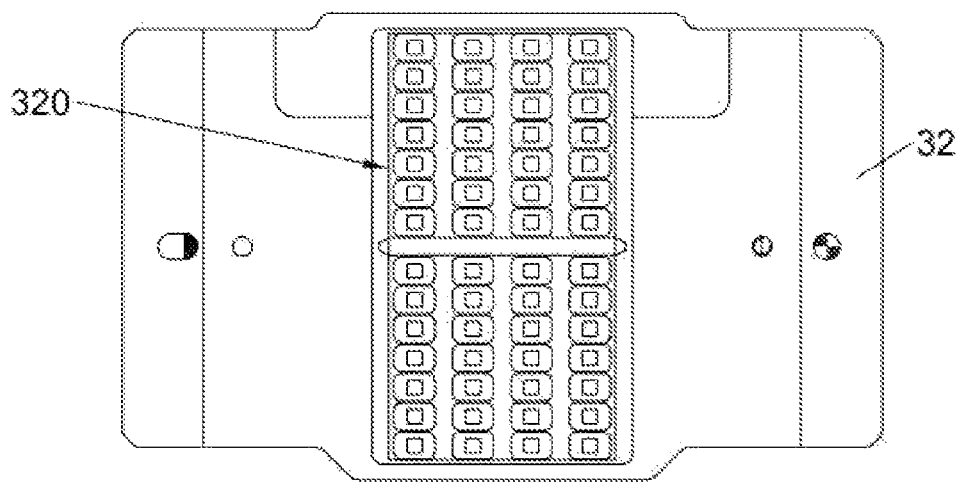
FIG. 14C is a rear view of the upper carrier.
Figure 15:
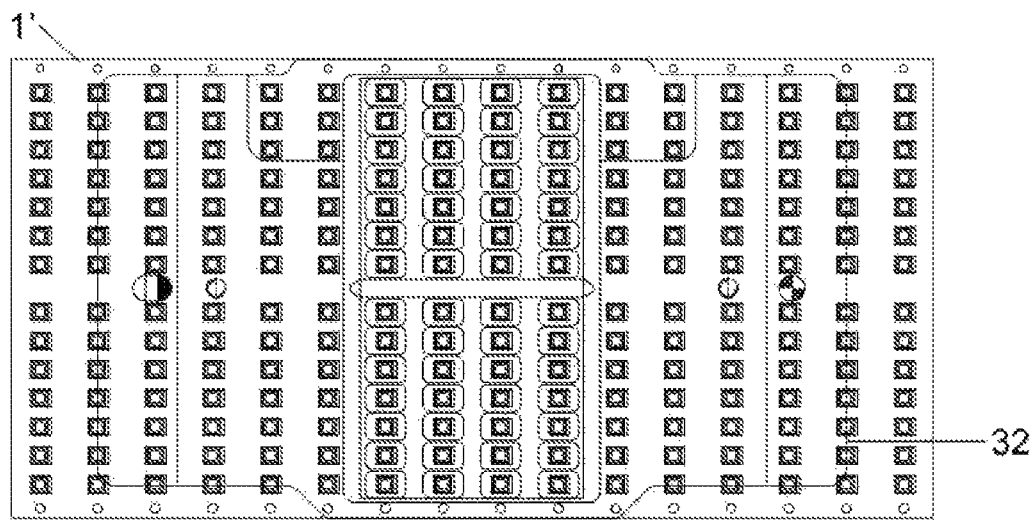
FIG. 15 is a view of a positional relationship between the internal surface of the upper carrier and the frame when the internal surface of the upper carrier and the frame are combined.

In an embodiment, the following is described using the carrier 30 used in the step of wire bonding as an example. As shown in FIGS. 13A to 13C, 14A to 14C, and 15, the carrier 30 includes a lower carrier 31 and an upper carrier 32 which mutually mate with each other. As shown in FIG. 13A, four columns of grooves 30 are disposed in the middle of the lower carrier 31 and correspond to the four columns of lamp bead holders 1 in the middle of the frame F. As shown in FIGS. 14A to 14C, FIG. 14A and FIG. 14C show the outer surface and the inner surface of the upper carrier 32, respectively. A hollow portion 320 is disposed in the middle of the upper carrier 32 to expose soldering surfaces (that is, the chip mounting surfaces 100) of the four columns of lamp bead holders 1. As shown in FIG. 15, FIG. 15 shows the assembly mating between the frame 1' and the inner surface of the upper carrier 32. In the step of wire bonding, the upper carrier 32, the frame 1', and the lower carrier 31 are laminated from top to bottom and mate with each other. The soldering surfaces of the four columns of lamp bead holders 1 are exposed from the outer surface of the upper carrier 32 so as to implement wire bonding, and the four columns of grooves 30 of the lower carrier 31 correspondingly carry the support structures 112 located on the bottom sides of the four columns of lamp bead holders 1 so that the soldering surfaces on the top sides of the four columns of lamp bead holders 1 are kept horizontal to meet the operational requirements of wire bonding.

Embodiment Two

Figure 16A:
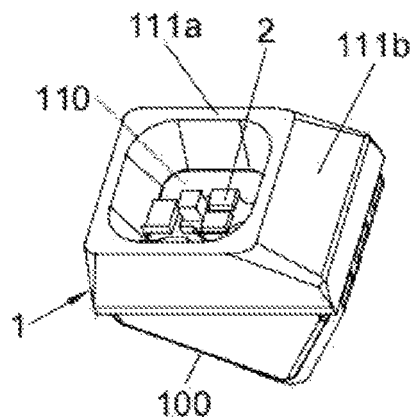
FIG. 16A is a perspective view of a beveled light-emitting lamp bead with an inclination angle of 35° in Embodiment two.
Figure 16B:
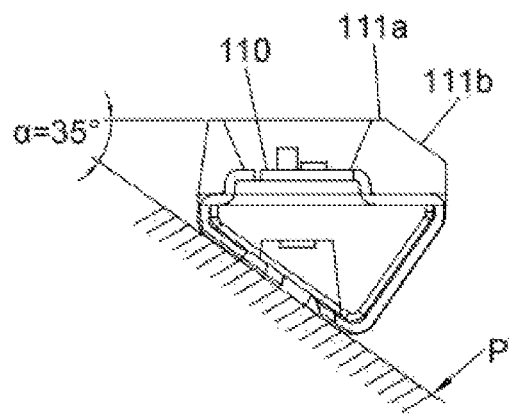
FIG. 16B is a view of the installation of the beveled light-emitting lamp bead of Embodiment two on a plane.

As shown in FIGS. 16A and 16B, the beveled light-emitting lamp bead and the beveled light-emitting lamp bead holder in this embodiment are substantially the same as the beveled light-emitting lamp bead and the beveled light-emitting lamp bead holder in Embodiment one, and the difference is that the inclination angle α in this embodiment is 35°.

Embodiment Three

Figure 17A:
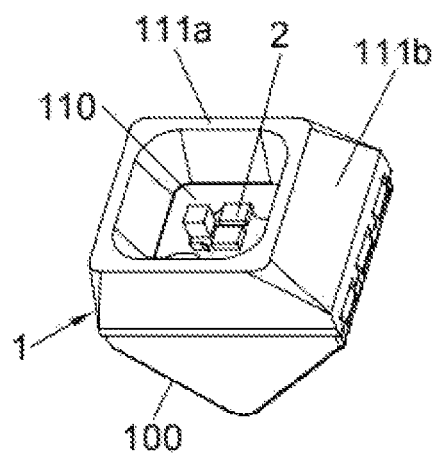
FIG. 17A is a perspective view of a beveled light-emitting lamp bead with an inclination angle of 50° in Embodiment three.
Figure 17B:
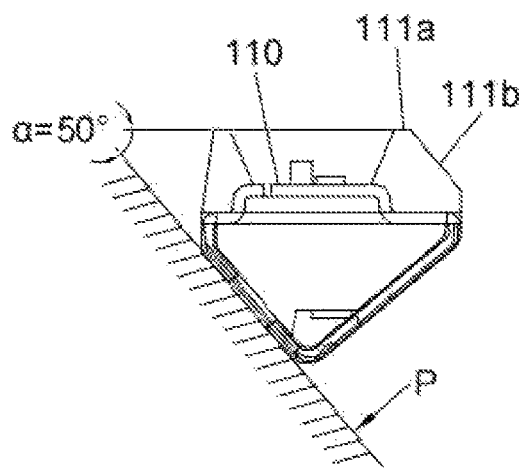
FIG. 17B is a view of the installation of the beveled light-emitting lamp bead of Embodiment three on a plane.

As shown in FIGS. 17A and 17B, the beveled light-emitting lamp bead and the beveled light-emitting lamp bead holder in this embodiment are substantially the same as the beveled light-emitting lamp bead and the beveled light-emitting lamp bead holder in Embodiment one, and the difference is that the inclination angle α in this embodiment is 50°.

Embodiment Four

Figure 18A:
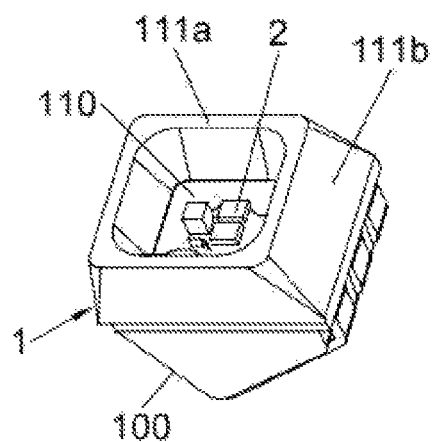
FIG. 18A is a perspective view of a beveled light-emitting lamp bead with an inclination angle of 60° in Embodiment four.
Figure 18B:
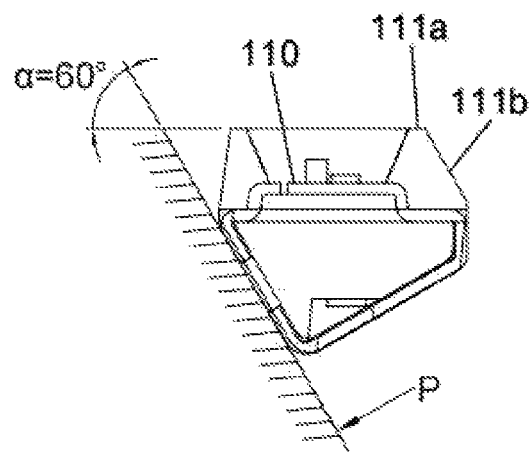
FIG. 18B is a view of the installation of the beveled light-emitting lamp bead of Embodiment four on a plane.

As shown in FIGS. 18A and 18B, the beveled light-emitting lamp bead and the beveled light-emitting lamp bead holder in this embodiment are substantially the same as the beveled light-emitting lamp bead and the beveled light-emitting lamp bead holder in Embodiment one, and the difference is that the inclination angle α in this embodiment is 60°.

In the description of the present disclosure, it is to be noted that the positional or orientational relationships indicated by terms such as "length", "width", "thickness", "up", "down", "front", "back", "left", "right", "vertical", "horizontal", "top", "bottom", "inside", and "outside" are those based on the drawings. These positional or orientational relationships are intended to facilitate and simplify the description of the present disclosure and not to indicate or imply that a device or element referred to must have a particular orientation or must be constructed or operated in a particular orientation. Thus, these positional or orientational relationships are not to be construed as limiting the present disclosure.

Moreover, terms like "first" and "second" are only used for the purpose of description and are not to be construed as indicating or implying relative importance or implicitly indicating the number of technical features indicated. Thus, a feature defined as a "first" feature or a "second" feature may explicitly or implicitly include one or more of such features. In the description of the present disclosure, the term "plurality", "several" or "multiple" is defined as two or more, unless expressly and specifically limited otherwise.

The preceding embodiments are merely several embodiments of the present disclosure, and the specific and detailed description thereof cannot be construed as limiting the scope of the present disclosure. It is to be noted that those of ordinary skill in the art can make a number of variations and improvements without departing from the concept of the present disclosure, and such variations and improvements are within the scope of the present disclosure.

What is claimed is:

1. A beveled light-emitting lamp bead holder, comprising: a holder body and a metal holder embedded in the holder body,
wherein the holder body is divided by the metal holder into a cup shield located on a top side and a support structure located on a bottom side, a cup bottom in the cup shield is provided with a chip mounting surface parallel to a cup rim top surface, a bottom portion of the support structure is provided with a soldering plane, the soldering plane is electrically connected to the chip mounting surface through the metal holder, and an inclination angle is formed between the chip mounting surface and the soldering plane.

2. The beveled light-emitting lamp bead holder according to claim 1, wherein a top portion of the cup shield is provided with a suction surface connected to the cup rim top surface, and the suction surface is parallel to the soldering plane.

3. The beveled light-emitting lamp bead holder according to claim 2, wherein a width of the suction surface is greater than or equal to 1 mm.

4. The beveled light-emitting lamp bead holder according to claim 1, wherein the metal holder penetrates the holder body from the chip mounting surface to outer side surfaces of the holder body to be connected to the soldering plane, a portion of the metal holder penetrating out of the holder body is metal pins, and the metal pins extend along a surface of the support structure to the soldering plane and comprise a first set of pins and a second set of pins located on opposite sides of the support structure, respectively.

5. The beveled light-emitting lamp bead holder according to claim 4, wherein a portion of the metal holder penetrating the holder body comprises a bent portion and a horizontal connection portion which are connected to each other, the bent portion is bent from the chip mounting surface toward the cup shield or the support structure, and the horizontal connection portion is parallel to the chip mounting surface.

6. The beveled light-emitting lamp bead holder according to claim 4, wherein the support structure is in a prismatic shape and comprises the soldering plane and a connection side surface perpendicular to the soldering plane, and the connection side surface is connected to the soldering plane to form a prismatic edge; the first set of pins penetrates out from an outer side surface of the holder body, is bent and extends to the soldering plane, and the second set of pins penetrates out from an outer side surface of the holder body, is bent and extends from the connection side surface to the soldering plane; and a length of the second set of pins is greater than a length of the first set of pins.

7. The beveled light-emitting lamp bead holder according to claim 4, wherein the surface of the support structure protrudes outwardly to form a baffle for separating adjacent metal pins.

8. The beveled light-emitting lamp bead holder according to claim 7, wherein a protruding height of the baffle is less than half of a thickness of a metal pin.

9. The beveled light-emitting lamp bead holder according to claim 1, wherein an angle range of the inclination angle is 10° to 80°.

10. A beveled light-emitting lamp bead, comprising: a beveled light-emitting lamp bead holder and a light-emitting diode (LED) chip,
wherein the beveled light-emitting lamp bead holder comprises a holder body and a metal holder embedded in the holder body, the holder body is divided by the metal holder into a cup shield located on a top side and a support structure located on a bottom side, a cup bottom in the cup shield is provided with a chip mounting surface parallel to a cup rim top surface, a bottom portion of the support structure is provided with a soldering plane, the soldering plane is electrically connected to the chip mounting surface through the metal holder, and an inclination angle is formed between the chip mounting surface and the soldering plane; and
wherein the LED chip is disposed on the chip mounting surface in the cup shield.

11. The beveled light-emitting lamp bead according to claim 10, wherein a top portion of the cup shield is provided with a suction surface connected to the cup rim top surface, and the suction surface is parallel to the soldering plane.

12. The beveled light-emitting lamp bead according to claim 11, wherein a width of the suction surface is greater than or equal to 1 mm.

13. The beveled light-emitting lamp bead according to claim 10, wherein the metal holder penetrates the holder body from the chip mounting surface to outer side surfaces of the holder body to be connected to the soldering plane, a portion of the metal holder penetrating out of the holder body is metal pins, and the metal pins extend along a surface of the support structure to the soldering plane and comprise a first set of pins and a second set of pins located on opposite sides of the support structure, respectively.

14. The beveled light-emitting lamp bead according to claim 13, wherein a portion of the metal holder penetrating the holder body comprises a bent portion and a horizontal connection portion which are connected to each other, the bent portion is bent from the chip mounting surface toward the cup shield or the support structure, and the horizontal connection portion is parallel to the chip mounting surface.

15. The beveled light-emitting lamp bead according to claim 13, wherein the support structure is in a prismatic shape and comprises the soldering plane and a connection side surface perpendicular to the soldering plane, and the connection side surface is connected to the soldering plane to form a prismatic edge; the first set of pins penetrates out from an outer side surface of the holder body, is bent and extends to the soldering plane, and the second set of pins penetrates out from an outer side surface of the holder body, is bent and extends from the connection side surface to the soldering plane; and a length of the second set of pins is greater than a length of the first set of pins.

16. The beveled light-emitting lamp bead according to claim 13, wherein the surface of the support structure protrudes outwardly to form a baffle for separating adjacent metal pins.

17. The beveled light-emitting lamp bead according to claim 16, wherein a protruding height of the baffle is less than half of a thickness of a metal pin.

18. The beveled light-emitting lamp bead according to claim 10, wherein an angle range of the inclination angle is 10° to 80°.

19. A method for manufacturing the beveled light-emitting lamp bead according to claim 10, comprising steps of die attachment and bonding, encapsulating, and die cutting, wherein the step of die attachment and bonding comprises: carrying the lamp bead holder using a carrier to keep the chip mounting surface in the holder body horizontal, placing and fixing the LED chip on the chip mounting surface in the cup shield, and bonding the LED chip to the metal holder; wherein the carrier is provided with a groove, and the groove is configured to load the support structure located on the bottom side of the holder body.

20. A display device, comprising a beveled light-emitting lamp bead, wherein the beveled light-emitting lamp bead comprises a lamp bead holder and a light-emitting diode (LED) chip, wherein the beveled light-emitting lamp bead holder comprises a holder body and a metal holder embedded in the holder body, the holder body is divided by the metal holder into a cup shield located on a top side and a support structure located on a bottom side, a cup bottom in the cup shield is provided with a chip mounting surface parallel to a cup rim top surface, a bottom portion of the support structure is provided with a soldering plane, the soldering plane is electrically connected to the chip mounting surface through the metal holder, and an inclination angle is formed between the chip mounting surface and the soldering plane; and wherein the LED chip is disposed on the chip mounting surface in the cup shield.

* * * * *